(12) United States Patent
Yamazaki et al.

(10) Patent No.: US 11,784,632 B2
(45) Date of Patent: Oct. 10, 2023

(54) VIBRATOR DEVICE, MANUFACTURING METHOD OF VIBRATOR DEVICE, ELECTRONIC DEVICE, AND VEHICLE

(71) Applicant: SEIKO EPSON CORPORATION, Tokyo (JP)

(72) Inventors: Takashi Yamazaki, Shiojiri (JP); Osamu Kawauchi, Shiojiri (JP); Akihiko Ebina, Fujimi-Machi (JP)

(73) Assignee: Seiko Epson Corporation, Tokyo (JP)

( * ) Notice: Subject to any disclaimer, the term of this patent is extended or adjusted under 35 U.S.C. 154(b) by 907 days.

(21) Appl. No.: 16/551,137

(22) Filed: Aug. 26, 2019

(65) Prior Publication Data

US 2020/0067484 A1    Feb. 27, 2020

(30) Foreign Application Priority Data

Aug. 27, 2018 (JP) ................. 2018-158072

(51) Int. Cl.
| | |
|---|---|
| H03H 9/205 | (2006.01) |
| H03H 9/05 | (2006.01) |
| H03H 9/10 | (2006.01) |
| B23K 26/362 | (2014.01) |
| H03H 3/04 | (2006.01) |
| H03H 9/15 | (2006.01) |
| H03H 3/02 | (2006.01) |

(52) U.S. Cl.
CPC ........... *H03H 9/205* (2013.01); *B23K 26/362* (2013.01); *H03H 3/04* (2013.01); *H03H 9/0595* (2013.01); *H03H 9/1014* (2013.01); *H03H 2003/027* (2013.01); *H03H 2003/0457* (2013.01); *H03H 2009/155* (2013.01)

(58) Field of Classification Search
CPC ........ H03H 9/205; H03H 9/04; H03H 9/0595; H03H 9/1014; H03H 9/1021; H03H 9/2489; H03H 9/2405; H03H 9/1057; H03H 9/02244; H03H 3/04; H03H 3/0072; H03H 3/02; H03H 2003/027; H03H 2003/0457; H03H 2003/155; B23K 26/362
See application file for complete search history.

(56) References Cited

U.S. PATENT DOCUMENTS

| | | | |
|---|---|---|---|
| 2007/0046151 A1* | 3/2007 | Aratake | H03H 9/1035 310/344 |
| 2009/0013519 A1 | 1/2009 | Park et al. | |
| 2011/0193645 A1* | 8/2011 | Tange | H03H 9/17 331/158 |
| 2013/0082792 A1* | 4/2013 | Arimatsu | H03H 9/1021 331/158 |
| 2016/0329877 A1* | 11/2016 | Nishimura | H03H 9/0595 |
| 2020/0259476 A1* | 8/2020 | Hirota | H03H 9/1057 |

FOREIGN PATENT DOCUMENTS

| | | |
|---|---|---|
| JP | 2009-022003 | 1/2009 |
| JP | 2010-223850 | 10/2010 |
| JP | 2015-231191 | 12/2015 |

* cited by examiner

*Primary Examiner* — Jeffrey M Shin
(74) *Attorney, Agent, or Firm* — WORKMAN NYDEGGER

(57) ABSTRACT

A vibrator device includes: a base; a vibrator disposed in the base; and a lid including a substrate having a light transmitting property and a silicon substrate joined to the substrate and a part of the base surrounding the vibrator.

8 Claims, 11 Drawing Sheets

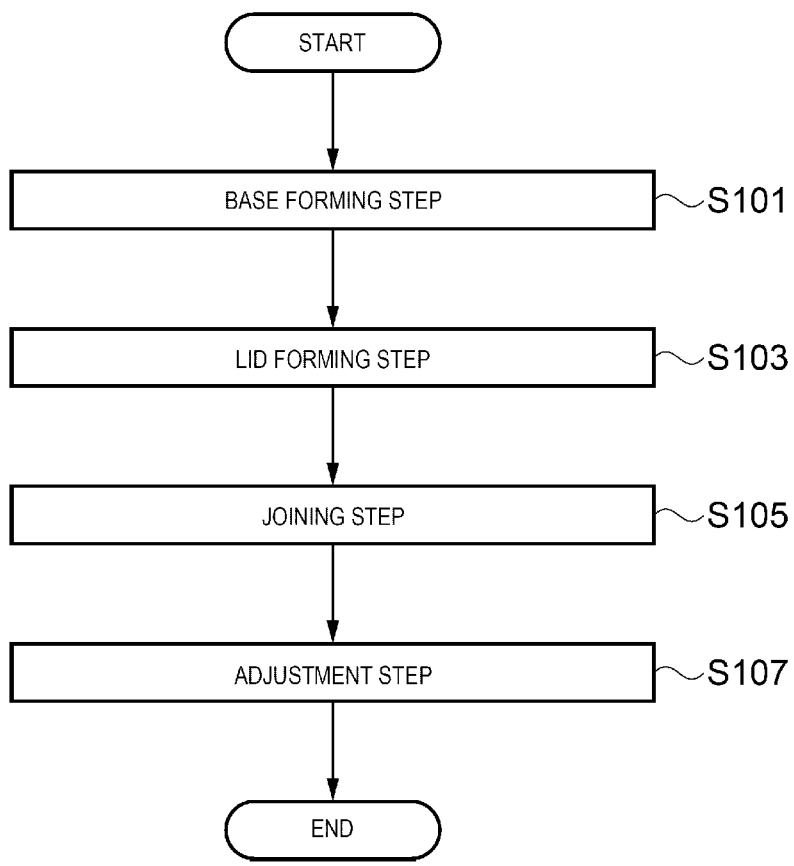

VIBRATOR DEVICE, MANUFACTURING METHOD OF VIBRATOR DEVICE, ELECTRONIC DEVICE, AND VEHICLE

The present application is based on, and claims priority from JP Application Serial Number 2018-158072, filed Aug. 27, 2018, the disclosure of which is hereby incorporated by reference herein in its entirety.

BACKGROUND

1. Technical Field

The present disclosure relates to a vibrator device, a manufacturing method of the vibrator device, an electronic device, and a vehicle.

2. Related Art

In the related art, in order to realize a small and thin vibrator device, for example, JP-A-2009-22003 discloses a quartz crystal vibrator, as an example of a vibrator device, in which a vibrating element is formed on a flat-plate-form base made of silicon or glass, a recess form lid made of a silicon or glass is disposed such that the vibrating element is accommodated in a recess of the recess form.

However, in a configuration of JP-A-2009-22003, when silicon is used for a lid, there is a problem where it is not possible to perform characteristic adjustment or the like, which is performed, for example, using a laser beam or the like, with respect to the accommodated vibrating element after joining the base and the lid, due to a low light transmittance of silicon. Further, when glass is used for a lid, there is a problem where variation in a form of the lid is increased due to an isotropic etching if a wet etching method capable of forming a recess section while maintaining a light transmitting property, is used.

SUMMARY

A vibrator device according to an aspect of the present disclosure includes: a base provided with a vibrator at one surface side; and a lid including a substrate having a light transmitting property and a frame-form silicon substrate joined to the substrate, in which the silicon substrate is joined to a part of the base surrounding the vibrator in the one side.

In the vibrator device described above, the substrate may be glass.

In the vibrator device described above, the glass may contain an alkali ion.

In the vibrator device described above, the vibrator may include a vibrating section integrally configured with the base, a piezoelectric body disposed above the vibrating section, and an electrode disposed above a surface of the piezoelectric body.

A manufacturing method of a vibrator device according to another aspect of the present disclosure includes: a base forming step of forming a vibrator at one surface side of a base; a lid forming step of joining a silicon substrate to a substrate having a light transmitting property and forming a lid by etching the silicon substrate in a frame-form; and a joining step of joining the silicon substrate to a part of the base surrounding the vibrator of the one surface.

In the manufacturing method of a vibrator device described above, in the base forming step, an outer form of the vibrator including the vibrating section may be formed, a piezoelectric body may be formed in the vibrating section, and an electrode may be formed on a surface of the piezoelectric body.

The manufacturing method of a vibrator device described above may further include an adjustment step of removing a part of the electrode by irradiating the electrode with a laser beam transmitted through the lid, after the joining step.

An electronic device according to still another aspect of the present disclosure includes the vibrator device according to any one of the above and a controller that performs a control based on an output signal of the vibrator device.

A vehicle according to still another aspect of the present disclosure includes the vibrator device according to any one of the above and a controller that performs a control based on an output signal of the vibrator device.

BRIEF DESCRIPTION OF THE DRAWINGS

FIG. 3 is a step flowchart showing a manufacturing method of the vibrator device.

DESCRIPTION OF EXEMPLARY EMBODIMENTS

Hereinafter, an embodiment will be described with reference to the drawings. Note that the following description is an embodiment of the present disclosure, and does not limit the present disclosure. Also, not all of the configurations described below are necessarily essential components of the present disclosure. Further, in each of the following figures, in order to make explanation intelligible, it may be described by the scale different from actual.

Embodiment

1. Vibrator Device

Figure 1:
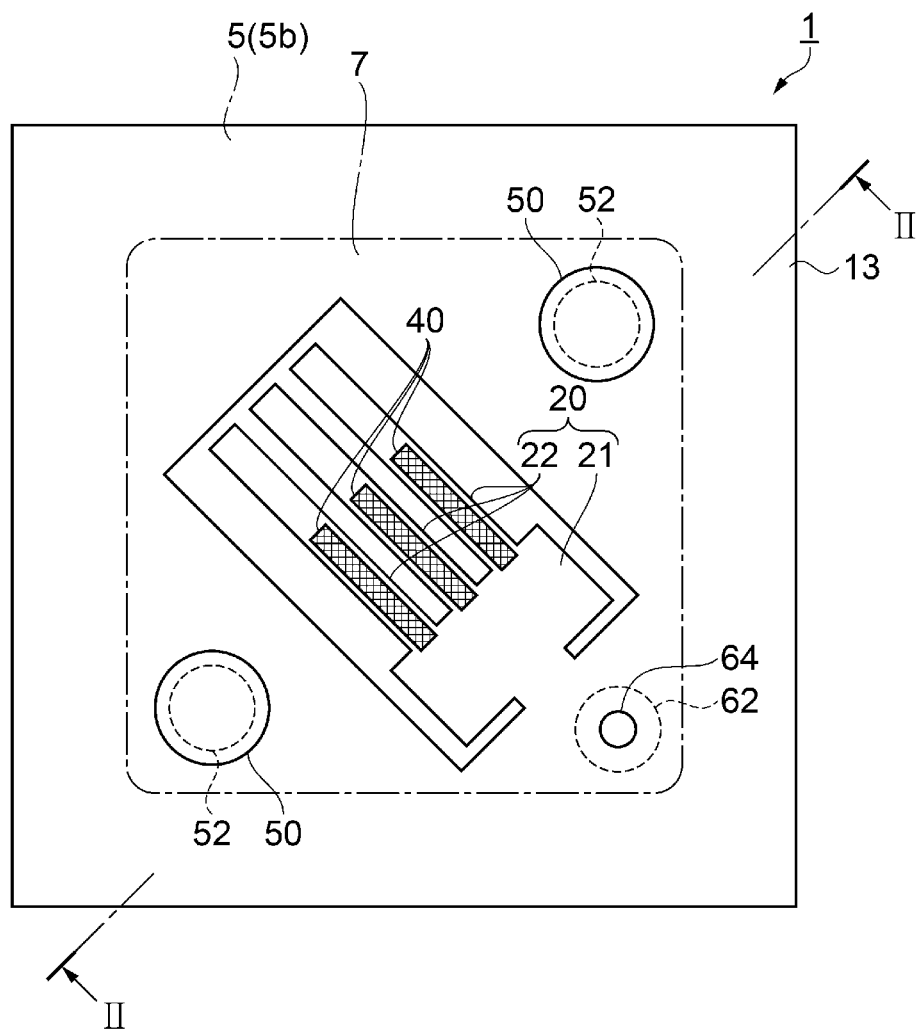
FIG. 1 is a schematic plan view showing a configuration of a vibrator device according to an embodiment.
Figure 2:
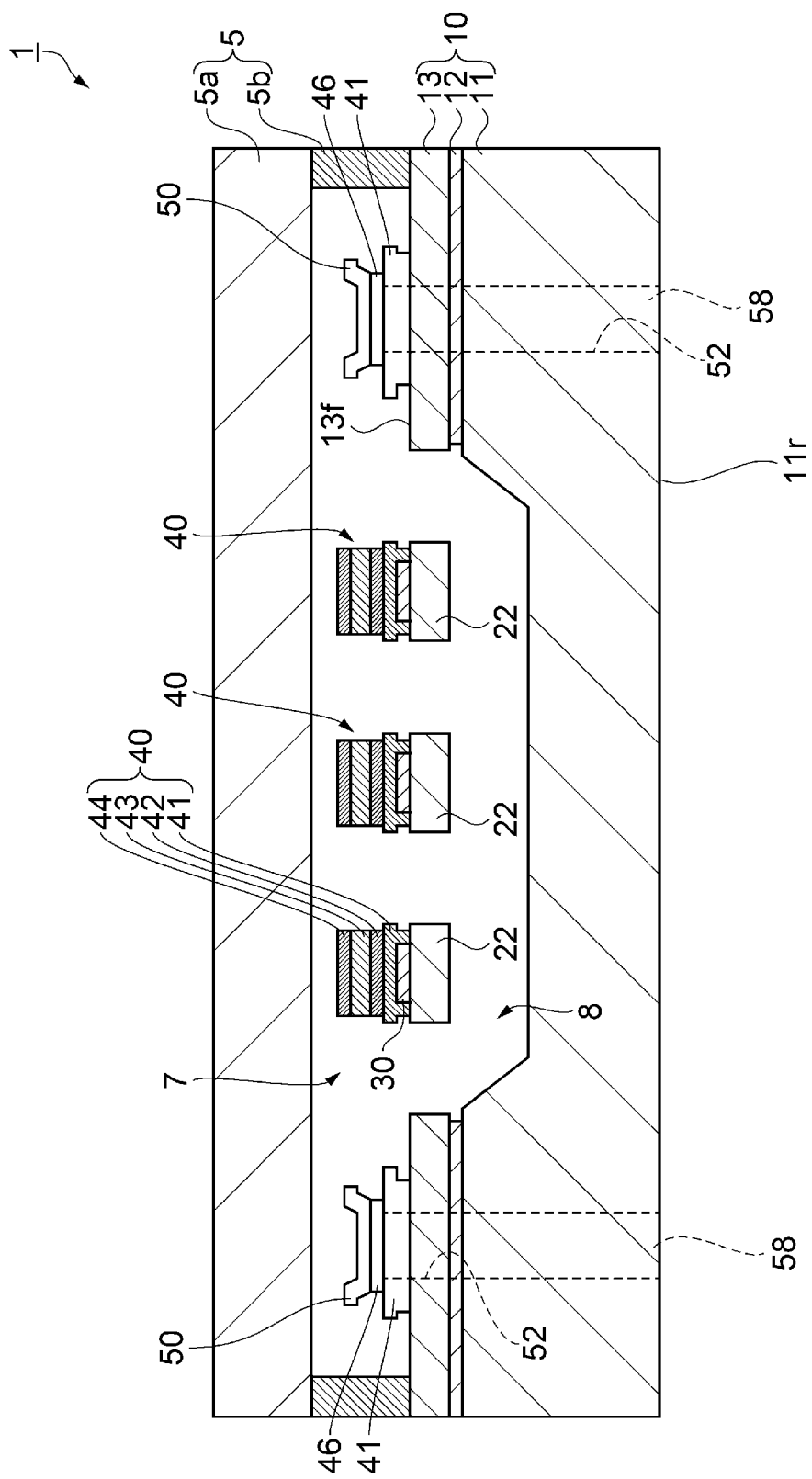
FIG. 2 is a cross-sectional view taken along line II-II in FIG. 1 showing a configuration of the vibrator device.

First, a vibrator device 1 according to an embodiment will be described with reference to FIGS. 1 and 2. FIG. 1 is a schematic plan view showing a configuration of the vibrator device 1 according to the embodiment. FIG. 2 is a schematic cross-sectional view taken along line II-II shown in FIG. 1. Note that in FIG. 1, for convenience of describing an internal configuration of the vibrator device 1, a state in which a lid 5 is removed, is shown.

The vibrator device 1 according to the present embodiment is, as shown in FIGS. 1 and 2, configured to include a silicon on insulator (SOI) substrate 10 as a base on which a micro electro mechanical systems (MEMS) element 20 as a vibrator is formed at one surface side, and the lid 5 as a covering object that hermetically seals the MEMS element 20 and can enclose the MEMS element 20. The MEMS element 20 includes three vibrating sections 22 and functions as a vibrating element for vibrating adjacent vibrating sections 22 in reverse phase. The vibrating section may be referred to as a vibrating arm or the like.

The lid 5, which functions as a covering object, includes a glass substrate 5a as a substrate having a light transmitting property and a frame-form silicon substrate 5b joined to the glass substrate 5a. The glass substrate 5a and the silicon substrate 5b are joined, for example, using an anode joining method. "Light" includes a visible light region, a near infrared light region, a mid infrared light region, and a far infrared light region. The visible light region here has a wavelength in a range of 350 nm to 700 nm, the near infrared light region has a wavelength in a range of 700 nm to 2.5 μm, the mid infrared light region has a wavelength in a range of 2.5 μm to 4 μm, and the far infrared light region has a wavelength in a range of 4 μm to 1000 μm.

The glass substrate 5a is made of glass having a light transmitting property with a thickness of substantially 100 μm, that is, so-called a transparent glass. As described above, by using glass as a substrate having a light transmitting property, the substrate can be easily obtained at a low cost.

Note that it is preferable to use glass containing an alkali ion for the glass substrate 5a. The glass is, for example, preferably a borosilicate glass such as a Pyrex (registered trademark) glass or a Tampax (registered trademark) glass. The alkali ion is an alkali metal ion or a movable ion. As described above, by using glass containing an alkali ion for the glass substrate 5a, a joining between the glass substrate 5a and the silicon substrate 5b can be easily performed by an anode joining.

The silicon substrate 5b joined to the glass substrate 5a is made of single crystal silicon or the like with a thickness of substantially 50 μm. The silicon substrate 5b configures a frame-form along an outer edge of the glass substrate 5a, and an inner side of the frame functions as a cavity 7 for accommodating the MEMS element 20.

The cavity 7 of the lid 5 is formed in a recess form in which the silicon substrate 5b is exposed on side surfaces and the glass substrate 5a is exposed on a bottom surface, and is opened on an SOI substrate 10 side. The lid 5 is joined to the SOI substrate 10 by contacting a surface at a side on which the cavity 7 is provided with a part surrounding the MEMS element 20 of a surface at a side on which the MEMS element 20 of the SOI substrate 10 is formed. In other words, the silicon substrate 5b constituting the lid 5 is joined to the part surrounding the MEMS element 20 on one surface of the SOI substrate 10.

Here, the silicon substrate 5b joined to the glass substrate 5a can penetrate a part in a recess form with a high accuracy by, for example, a dry etching method. Thus, the silicon substrate 5b can be provided with a frame section provided in a frame-form along the outer edge of the silicon substrate 5b with a high dimensional accuracy. Note that the frame section is provided in a circumferential-form along the outer edge of the silicon substrate 5b. Therefore, it is possible to realize the lid 5 having a light transmitting property by the glass substrate 5a and having a small variation in a form of the frame section which is a part joined to the SOI substrate 10 by the silicon substrate 5b.

Note that in the above, the glass substrate 5a is described as an example of a substrate, which has a light transmitting property and constitutes the lid 5, but the present disclosure is not limited thereto. For example, a sapphire substrate, a quartz crystal substrate, an acrylic substrate, or the like can be applied as a substrate which has a light transmitting property and is capable of constituting the lid 5.

As shown in FIG. 2, the SOI substrate 10 as a substrate is a substrate in which a silicon layer 11, a buried oxide (BOX) layer 12, and a surface silicon layer 13 are laminated in this order. For example, the silicon layer 11 and the surface silicon layer 13 are made of single crystal silicon, and the BOX layer 12 is configured with a silicon oxide layer ($SiO^2$ or the like).

The SOI substrate 10 is provided with the MEMS element 20 made of a silicon of the surface silicon layer 13, an electrode pad 50 formed on the surface silicon layer 13, a plurality of wirings 46 coupling element electrodes for driving the MEMS element 20 and the electrode pads 50 together, a first wiring electrode 58 which is coupled to the electrode pad 50 and draws out the electrode on an outer surface 11r opposite to the one surface side on which the MEMS element 20 is formed, a first wiring through hole 52 for forming the first wiring electrode 58, and a through hole for hermetically sealing an internal space configured with the cavity 7 of the lid 5 and a cavity 8 formed in the SOI substrate 10. The through hole includes a first pore section 62, a second pore section 64 communicating with the first pore section 62, and a sealing section (not shown) for closing a communication section between the first pore section 62 and the second pore section 64.

The vibrator device 1 is configured such that the frame-form silicon substrate 5b of the lid 5 is joined by a direct joining with silicon-silicon on the surface silicon layer 13 of the SOI substrate 10 so as to accommodate the MEMS element 20 in the internal space configured with the cavity 7 and the cavity 8.

The MEMS element 20 has a base section 21 supported by the BOX layer 12, and a vibrating section 22 separated from the silicon around other than the base section 21 in a region where the BOX layer 12 is removed. The MEMS element 20 illustrated in the present embodiment has three vibrating sections 22 arranged in parallel. The silicon layer 11 and the BOX layer 12 at a position facing the vibrating sections 22 are provided with the cavity 8 that constitutes the internal space. Further, on an upper surface 13f of the surface silicon layer 13 which is a surface at the lid 5 side of the MEMS element 20, an element adjustment layer 30 which is a silicon oxide film disposed above an outer peripheral region of a through hole, which is for hermetically sealing a predetermined region or the internal space of the MEMS element 20, and a piezoelectric driver 40 covering at least a part of element adjustment layer 30, are provided.

The element adjustment layer 30 is provided to correct a temperature characteristic of a resonance frequency of the vibrating section 22. A silicon has a resonant frequency which decreases as the temperature increases, while a silicon oxide film has a resonant frequency which increases as the temperature increases. Therefore, by disposing the element adjustment layer 30 which is a silicon oxide film on the silicon MEMS element 20, the temperature characteristic of the resonant frequency of a combined object configured with the vibrating section 22 of the MEMS element 20 and the element adjustment layer 30, can be made to be flat.

The piezoelectric driver 40 provided in the vibrating section 22 includes a first protection film 41, a first electrode 42, a piezoelectric layer 43 as a piezoelectric body, and a second electrode 44. Note that in the present embodiment, the first electrode 42 and the second electrode 44 correspond to electrodes provided on the surface of the piezoelectric layer 43 as a piezoelectric body, and can also be referred to as element electrodes. In detail, the first electrode 42 is disposed above a surface at a side of the first protection film 41 of the piezoelectric layer 43, and the second electrode 44 is disposed above a surface at an opposite side of the first protection film 41 of the piezoelectric layer 43. Further, a configuration of the MEMS element 20 including a base section 21 integrally configured with the surface silicon layer 13 of the SOI substrate 10 as a base and the vibrating section 22, the first electrode 42, the piezoelectric layer as a piezoelectric body, and a second electrode 44, corresponds to a vibrator.

The first protection film 41 is made of a polysilicon which is not doped with impurities, but may be made of an amorphous silicon. Further, the first protection film 41 may be a laminated film of a polysilicon and an amorphous silicon. In the present embodiment, the first protection film 41 is provided to cover the element adjustment layer 30 disposed above the MEMS element 20. As described above, since the element adjustment layer 30 is provided between the first protection film 41 and the MEMS element 20, the first protection film 41 can protect the element adjustment layer 30 from a silicon oxide film etching around the piezoelectric driver 40.

The first electrode 42 and the second electrode 44 are disposed to sandwich the piezoelectric layer 43. In the example shown in the present embodiment, three sets of the first electrode 42, the piezoelectric layer 43, and the second electrode 44 are disposed corresponding to the three vibrating sections 22.

The plurality of wirings 46 are electrically coupled to the first electrode 42 and the second electrode 44 so as to vibrate the adjacent vibrating sections 22 in reverse phase. Further, the plurality of wirings 46 are electrically coupled to the electrode pad 50, and can vibrate the adjacent vibrating sections 22 in reverse phase by applying a voltage between the two electrode pads 50 from the outside via the first wiring electrode 58 or a wiring electrode (not shown).

Note that, as a material constituting these, for example, the piezoelectric layer 43 is made of an aluminum nitride (AlN) or the like, the first electrode 42 and the second electrode 44 are made of a titanium nitride (TiN) or the like, and the plurality of wirings 46 and the electrode pad 50 are made of an aluminum (Al), copper (Cu) or the like.

In the vibrator device 1, when a voltage is applied between the first electrode 42 and the second electrode 44 via the two electrode pads 50, the piezoelectric layer 43 expands and contracts accordingly, and the vibrating section 22 is vibrated. The vibration is highly excited at an inherent resonant frequency and an impedance is minimized. As a result, the vibrator device 1 oscillates at an oscillation frequency mainly determined by a resonance frequency of the vibrating section 22 by being connected to an oscillation circuit.

The first wiring through holes 52 are disposed one by one on both sides of the MEMS element 20 in a region of the cavity 7 of the lid 5 in plan view as shown in FIG. 1, and disposed at positions overlapping the electrode pads 50 of the surface silicon layer 13.

The electrode pad 50 is disposed so as to be electrically coupled to the first wiring electrode 58 via the wiring 46 at the position overlapping the first wiring through hole 52 in plan view. Further, the electrode pad 50 is disposed above the surface silicon layer 13 via the element adjustment layer 30, the first protection film 41, and the wiring 46 at the position not overlapping the first wiring through hole 52. With such a configuration, the electrode pad 50 and the first wiring electrode 58 are electrically coupled, and the first electrode 42 and the second electrode 44 can be drawn out to the outer surface 11r of a silicon layer 11 opposite to a side on which the MEMS element 20 is formed. Note that as a material of the first wiring electrode 58 is made of titanium (Ti), tungsten (W), copper (Cu) or the like. The first wiring electrode 58 is formed of a plating layer formed by a plating method.

The through hole functioning as a sealing hole for hermetically sealing the internal space formed by the cavity 7 of the lid 5 and the cavity 8 of the SOI substrate 10, includes a first pore section 62 penetrating the silicon layer 11 and the BOX layer 12 as an oxide film, and a second pore section 64 penetrating the surface silicon layer 13 and communicating with the first pore section 62.

The through hole is disposed in the region of the cavity 7 of the lid 5 and on the opposite side of the base section 21 to a side where the vibrating section 22 is provided, in plan view. The first pore section 62 constituting the through hole is disposed at a position overlapping the second pore section 64 provided in the surface silicon layer 13. Further, the first pore section 62 constituting the through hole is disposed in the silicon layer 11 and the BOX layer 12 so as to communicate with the second pore section 64.

The first pore section 62 penetrates the silicon layer 11 and the BOX layer 12 from the outer surface 11r of the silicon layer 11. A back surface of the surface silicon layer 13 serving as a communication section between the first pore section 62 and the second pore section 64 is opposite to an opening section opened on a side opposite to the outer surface 11r side by the first pore section 62. The first pore section 62 penetrates the surface silicon layer 13 so that the internal space side (cavity 7 side) of the surface silicon layer 13 and the second pore section 64 communicate with each other.

The through hole is sealed by a sealing section which is disposed from the back surface side of the surface silicon layer 13 serving as the communication section between the first pore section 62 and the second pore section 64 to the second pore section 64, and is filled with a sealing film or a sealing material or the like. Thereby, the internal space formed by the cavity 7 and the cavity 8 can be hermetically sealed.

As described above, according to the vibrator device 1 according to the present embodiment, the lid 5 is configured with the glass substrate 5a having a light transmitting property and a silicon substrate 5b joined to the glass substrate 5a. The glass substrate 5a has a light transmitting property, and the silicon substrate 5b, which is joined to the glass substrate 5a, can be processed into a frame-form with a high accuracy by using, for example, a dry etching. Therefore, it is possible to provide the vibrator device 1 using the lid 5 having a light transmitting property and a small variation in a form of the frame section which is the joining part with the SOI substrate 10. Further, since the lid 5 has a light transmitting property, even after the lid 5 and the SOI substrate 10 are joined, it is possible to easily perform an electrical characteristics adjustment of the MEMS element 20 as a vibrator accommodated in an accommodation space formed by the cavities 7 and 8, by using a laser beam or the like transmitted through the lid 5.

Note that the SOI substrate 10 as a base constituting vibrator device 1, can also be a glass substrate. In this case, the glass substrate as a base can be configured with a glass layer corresponding to the silicon layer 11 of the SOI substrate 10, a silicon oxide layer ($SiO_2$ or the like) corresponding to the BOX (buried oxide) layer 12 of the SOI substrate 10, and a surface glass layer corresponding to the surface silicon layer 13 of the SOI substrate 10 and constituting the MEMS element 20. Here, an anode joining or a direct joining can be applied for the joining with the lid 5 when the glass substrate is used as the base.

2. Manufacturing Method of Vibrator Device

Figure 6:
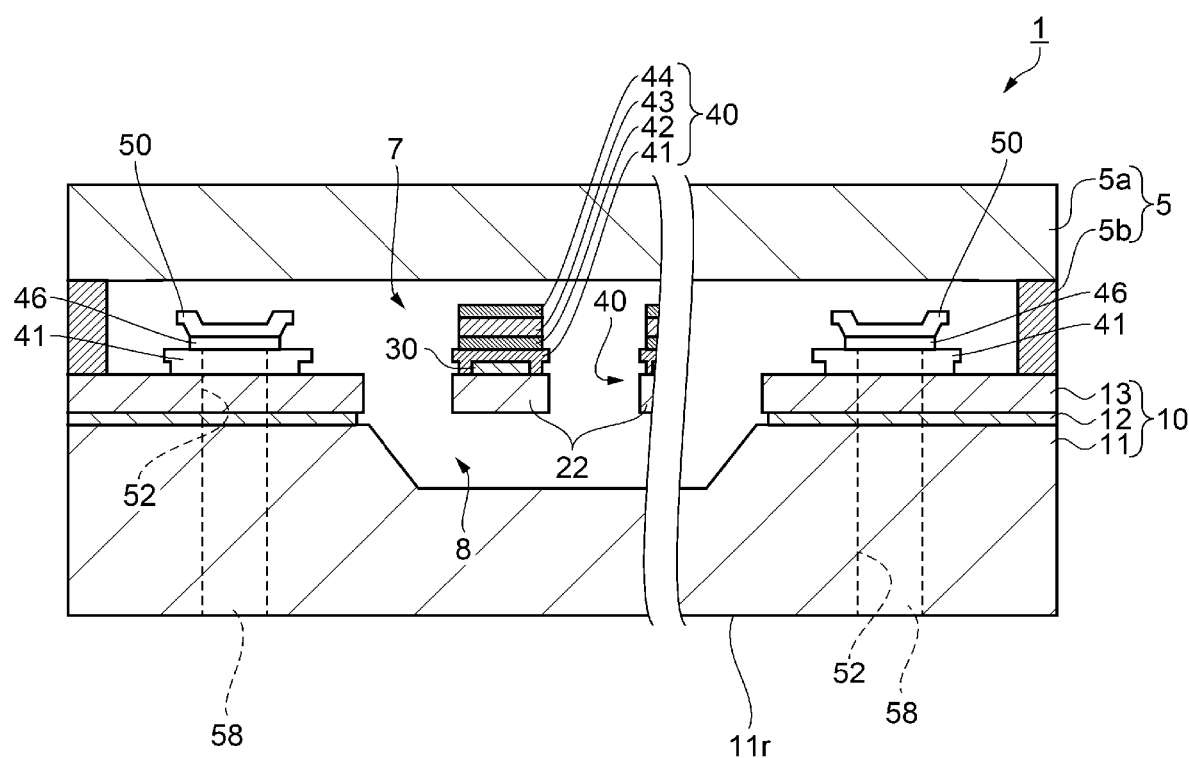
FIG. 6 is a schematic cross-sectional view showing a joining step of a base and the lid.
Figure 7:
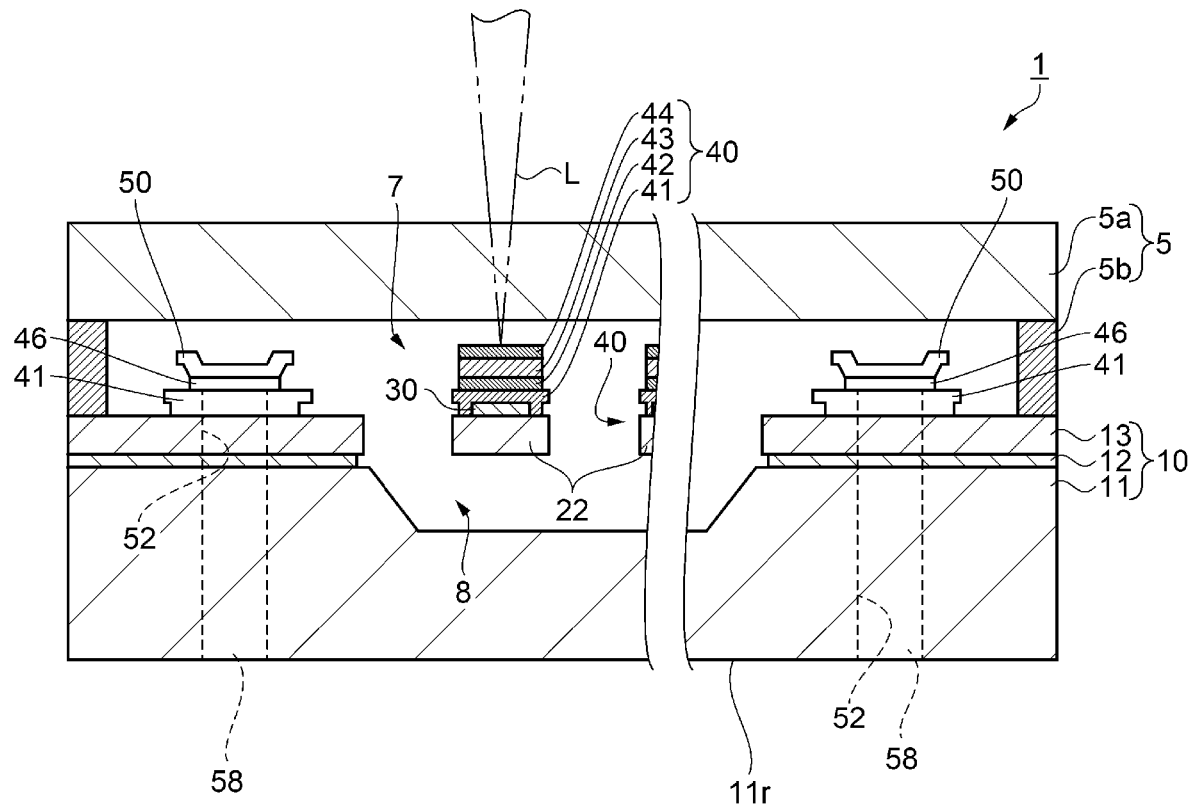
FIG. 7 is a schematic cross-sectional view showing an adjustment step of the MEMS element.

Next, a manufacturing method of the vibrator device 1 according to the present embodiment will be described with reference to FIGS. 3, 4A to 4J, 5A to 5E, 6, and 7. FIG. 3 is a step flowchart showing a manufacturing method of the vibrator device. FIGS. 4A to 4J are schematic cross-sectional views showing a manufacturing step of the MEMS element as a vibrator in the base. FIGS. 5A to 5E are schematic cross-sectional views showing a manufacturing step of the lid. FIG. 6 is a schematic cross-sectional view showing a joining step of a base and the lid. FIG. 7 is a schematic cross-sectional view showing an adjustment step of the MEMS element. Note that FIGS. 4A to 4J, 5A to 5E, and 6 are schematic cross-sectional views corresponding to the position of line II-II in FIG. 1. Further, a line which shows a background of a cross section is omitted. The same reference numerals are given to the respective constituent parts of the vibrator device 1 described above.

As shown in the flowchart of FIG. 3, the manufacturing method of the vibrator device 1 includes a base forming step (step S101), a lid forming step (step S103), and a joining step of joining the base and the lid (step S105). Furthermore, the manufacturing step of the vibrator device 1 includes an adjustment step (step S107) of adjusting the electrical characteristics of the vibrator device 1 after the joining step (step S105). Hereinafter, the manufacturing method of the vibrator device 1 will be described with reference to step description views of FIGS. 4A to 4J, 5A to 5E, 6, and 7.

Base Forming Step

In the base forming step (step S101), the MEMS element 20 as a vibrator is formed on one surface side of the SOI substrate 10 as a base. In detail, in the base forming step (step S101), an outer form of the MEMS element 20 including the vibrating section 22 is formed, the piezoelectric layer 43 is formed in the vibrating section 22, and the first electrode 42 and the second electrode 44 are formed on the surface of the piezoelectric layer 43. First, as a preparation step of the base forming step (step S101), the SOI substrate 10 is formed in which the silicon layer 11, the BOX layer 12, and the surface silicon layer 13 are laminated in this order. Hereinafter, the base forming step (step S101) will be described in detail by being divided into first to tenth steps.

Figure 4A:
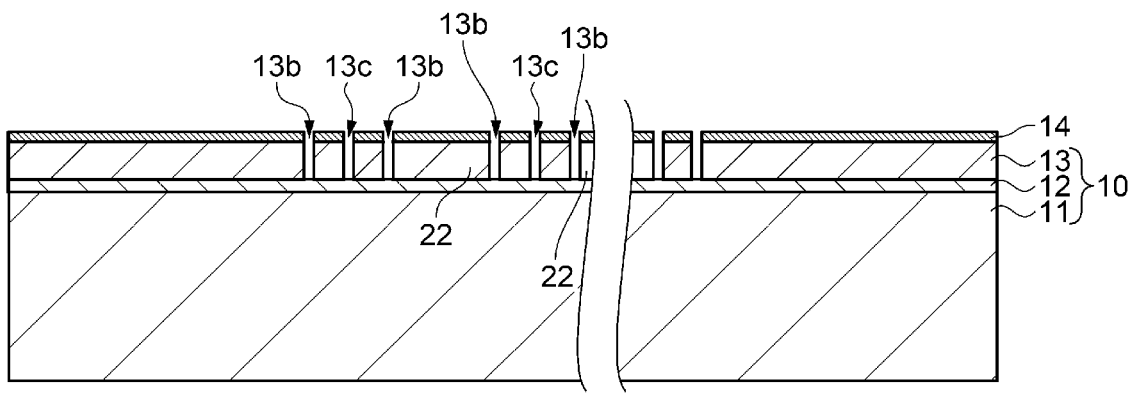
FIG. 4A is a schematic cross-sectional view showing a manufacturing step of a MEMS element as a vibrator.

First, in a first step, as shown in FIG. 4A, a trench 13b is formed in the surface silicon layer 13 of the SOI substrate 10 to separate a region to be the vibrating section 22 of the MEMS element 20 from the silicon around a region other than a region to be the base section 21 of the MEMS element 20. At this time, a trench (slit) 13c may be formed in a region separated from the vibrating section 22 of the MEMS element 20 by the trench 13b of the surface silicon layer 13 of the SOI substrate 10. By providing such a trench (slit) 13c, a release etching of the silicon around the vibrating section 22 to be performed later can be easily performed, in a region where a groove between the vibrating section 22 and the adjacent vibrating section 22 is wide.

Regarding a formation of the trench 13b, as shown in FIG. 4A, the trench 13b is formed in the surface silicon layer 13 to separate the region to be the vibrating section 22 of the MEMS element 20 from the silicon around the region other than the region to be the base section 21 of the MEMS element 20, by applying a resist 14 on the surface silicon layer 13, forming a mask pattern using a photolithography method, and etching the surface silicon layer 13 using the resist 14 as a mask. Note that a silicon oxide film may be formed by thermally oxidizing the surface of the surface silicon layer 13 of SOI substrate 10, a mask of a silicon oxide film may be formed by a photolithography method, and the trench 13b may be formed by etching the surface silicon layer 13. Note that, in the same step as the formation of the trench 13b, the second pore section 64 forming the through hole can be formed.

Figure 4B:
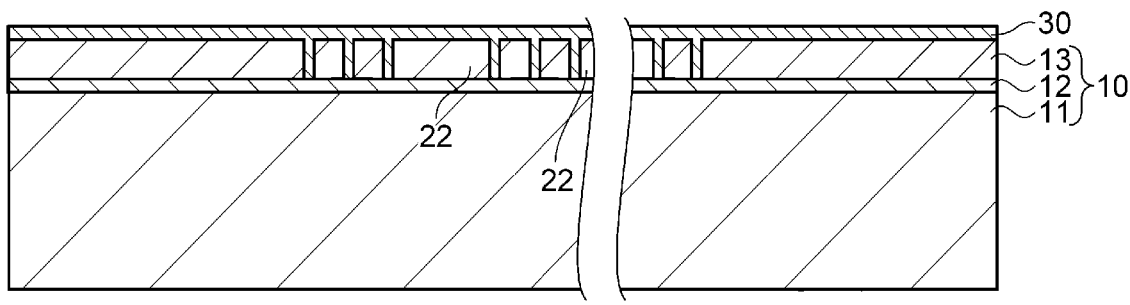
FIG. 4B is a schematic cross-sectional view showing a manufacturing step of the MEMS element.

In a second step, as shown in FIG. 4B, an element adjustment layer 30 which is a silicon oxide film is formed on an upper surface of the surface silicon layer 13 and a side wall in the trench 13b. For example, by thermally oxidizing the surface silicon layer 13 of the SOI substrate 10, a thermal oxide film (silicon oxide film) is formed on the upper surface of the surface silicon layer 13 and the side wall in the trench 13b. The thickness of the thermal oxide film is, for example, substantially 0.2 µm to 0.3 µm. The thermal oxide film serves as a protection wall for protecting the vibrating section 22 and the piezoelectric driver 40 from the release etching of the silicon around the vibrating section 22 to be performed later.

Next, the silicon oxide film for filling the trench 13b of the surface silicon layer 13 is formed by a chemical vapor deposition (CVD) method. At this time, even if wrinkles or pores are generated in the silicon oxide film inside the trench 13b, there is no problem because the thermal oxide film is strong. Further, since the trench 13b of the surface silicon layer 13 formed by processing is filled with the silicon oxide film and the surface becomes almost flat, it is possible to eliminate an adverse effect due to a level difference on a subsequent photolithography step.

Therefore, the thermal oxide film formed by thermally oxidizing the surface silicon layer 13 and the silicon oxide film formed by using the CVD method become the element adjustment layer 30 shown in FIG. 2. In the second step, the silicon oxide film may be formed by a thermal CVD method without forming a thermal oxide film, or the silicon oxide film may be formed by a two-step CVD method such as a thermal CVD method and a plasma CVD method.

Figure 4C:
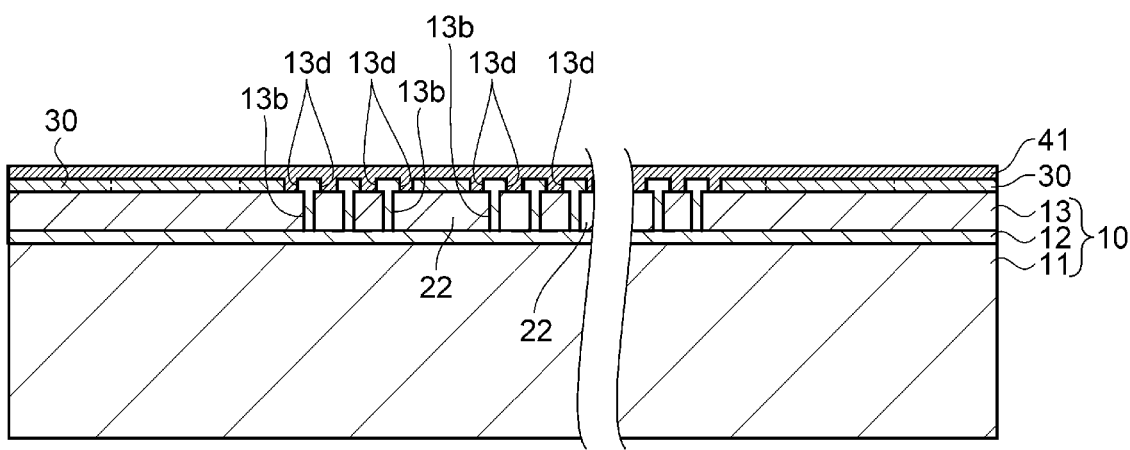
FIG. 4C is a schematic cross-sectional view showing a manufacturing step of the MEMS element.

In a third step, a resist is applied on the element adjustment layer 30, a mask pattern for protecting a predetermined region such as the MEMS element 20 including the vibrating section 22 is formed by using a photolithography method, and a trench 13d reaching the surface silicon layer 13 shown in FIG. 4C is formed by etching the element adjustment layer 30 using the resist as a mask. Thereafter, as shown in FIG. 4C, a first protection film 41 is formed on an upper surface of the element adjustment layer 30 and formed in the trench 13d by using a CVD method.

Figure 4D:
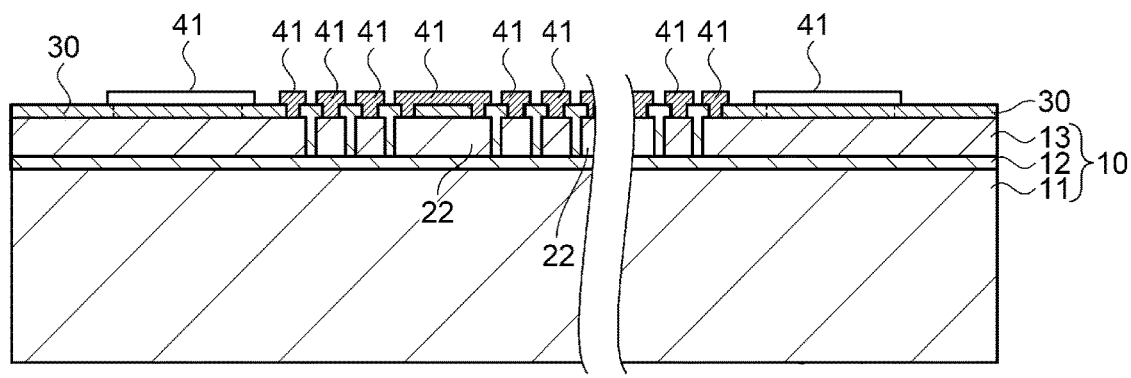
FIG. 4D is a schematic cross-sectional view showing a manufacturing step of the MEMS element.

In a fourth step, a resist is applied onto the first protection film 41, a mask pattern is formed by using the photolithography method, and the first protection film 41 is etched using the resist as a mask. Thereby, as shown in FIG. 4D, the first protection film 41 is formed in a region including a side surface of the element adjustment layer 30 formed in a predetermined region of the MEMS element 20 including the vibrating section 22.

The first protection film 41 covers the element adjustment layer 30 with the MEMS element 20. The thickness of the first protection film 41 is, for example, substantially 0.2 µm. Since an embeddability of the first protection film 41 by using the CVD method is satisfactory, a strong wall of the first protection film 41 for protecting the element adjustment layer 30 can be formed with a small thickness by the release etching of the silicon oxide film around the vibrating section 22 and the piezoelectric driver 40 which are performed later.

Figure 4E:
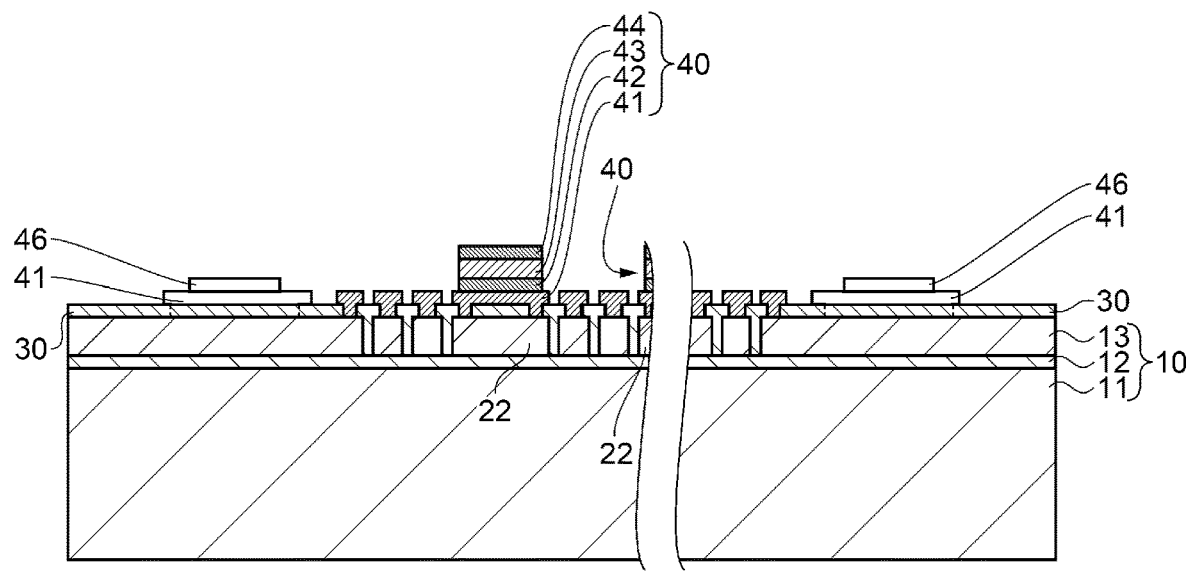
FIG. 4E is a schematic cross-sectional view showing a manufacturing step of the MEMS element.

In a fifth step, as shown in FIG. 4E, the first electrode 42, the piezoelectric layer 43, and the second electrode 44 are formed in this order by using the photolithography method, on the first protection film 41 formed in a predetermined region of the MEMS element 20. Note that the first protection film 41, the first electrode 42, the piezoelectric layer 43, and the second electrode 44 constitute a piezoelectric driver 40. Further, when forming the first electrode 42 and the second electrode 44, a wiring 46 for connecting the first electrode 42 and the electrode pad 50 to each other and a wiring 46 for connecting the second electrode 44 and the electrode pad 50 to each other, are also formed at the same time.

Figure 4F:
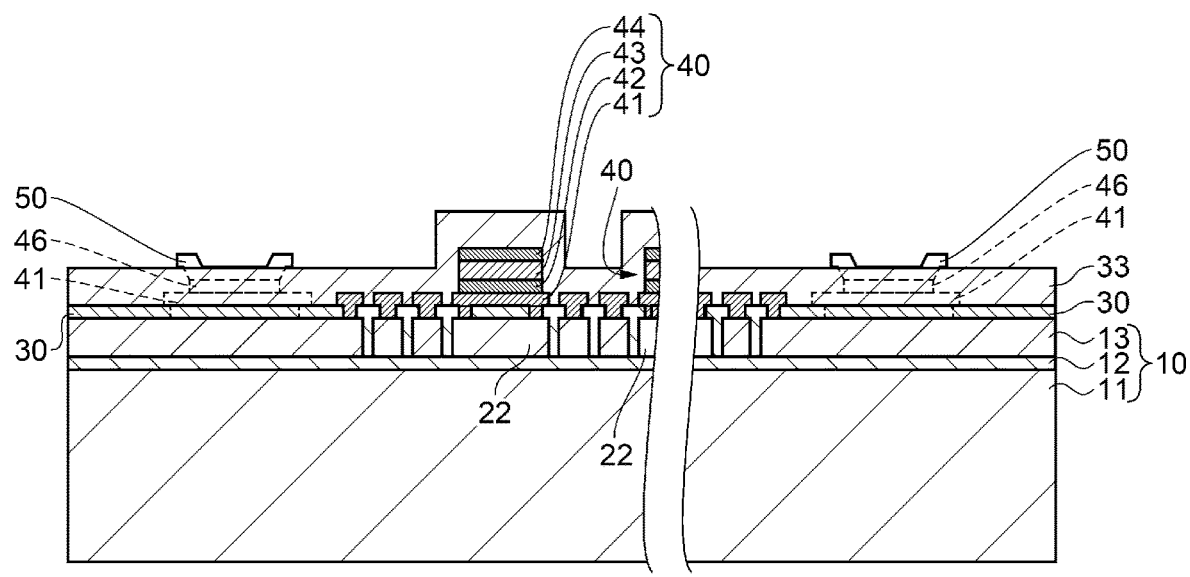
FIG. 4F is a schematic cross-sectional view showing a manufacturing step of the MEMS element.

In a sixth step, the silicon oxide film 33 is formed by using the CVD method on the SOI substrate 10 in which the piezoelectric driver 40 is formed. Thereafter, as shown in FIG. 4F, a mask pattern opened at a position where the electrode pad 50 is to be formed, is formed by using the photolithography method, an aluminum (Al), a copper (Cu) or the like is formed at a position where the electrode pad 50 is to be formed by using a sputtering method using the silicon oxide film 33 as a mask, and the electrode pad 50 is formed.

Figure 4G:
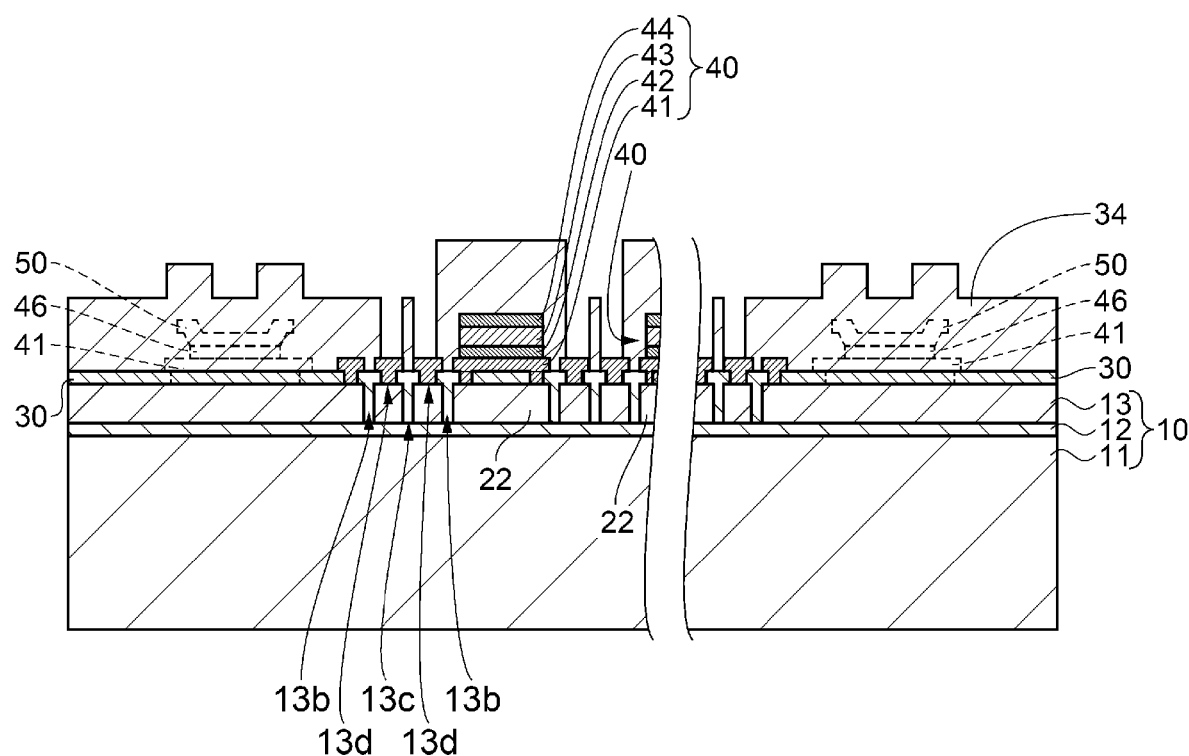
FIG. 4G is a schematic cross-sectional view showing a manufacturing step of the MEMS element.

In a seventh step, as shown in FIG. 4G, the silicon oxide film 34 is formed by using the CVD method on the SOI substrate 10 on which the electrode pad 50 or the silicon oxide film 33 is formed. Thereafter, a resist is applied onto the silicon oxide film 34, a mask pattern is formed by using the photolithography method, and the silicon oxide film 34 is etched using the resist as a mask. Thereby, a silicon oxide film 34 is formed in which a predetermined region corresponding to the trench 13d reaching the surface silicon layer 13 is opened.

Figure 4H:
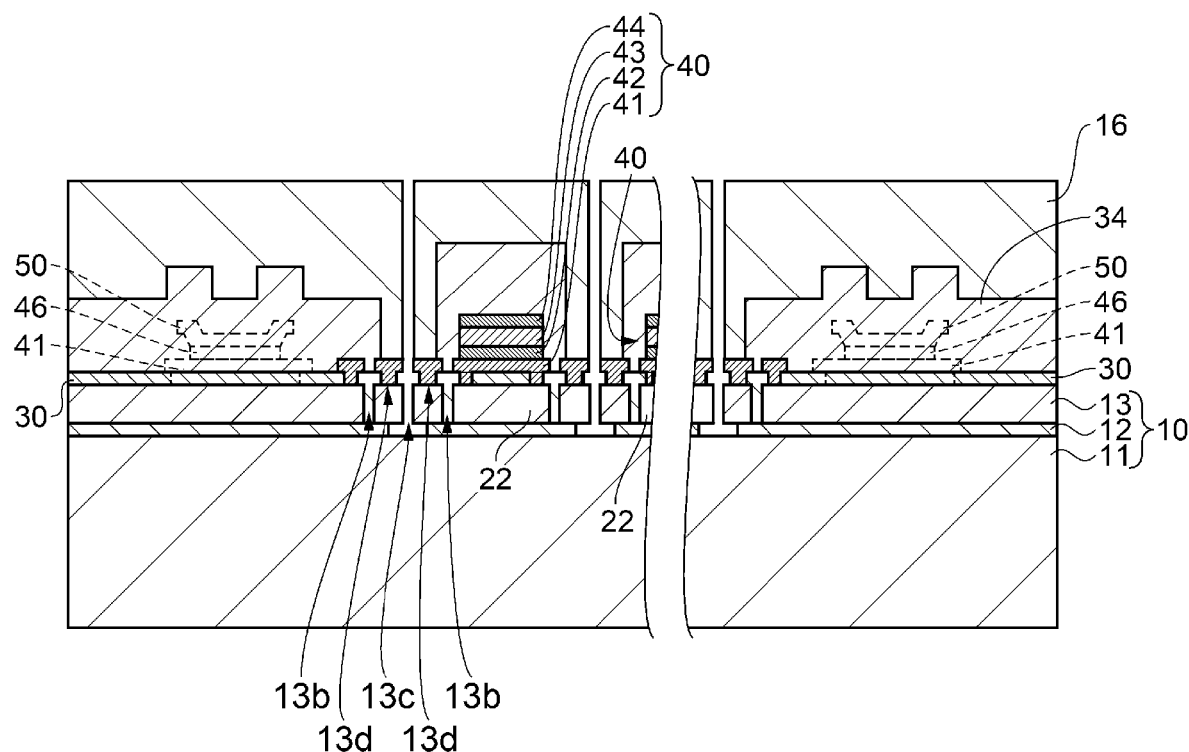
FIG. 4H is a schematic cross-sectional view showing a manufacturing step of the MEMS element.

In an eighth step, as shown in FIG. 4H, the resist 16 is applied on the silicon oxide film 34, a mask pattern is formed by using a photolithography method, and the silicon oxide film 34, the element adjustment layer 30, and the BOX layer 12, which correspond to the trench 13c, are etched in this order using the resist 16 as a mask. Thus, an opening section having a depth reaching the silicon layer 11 is formed so as to surround the periphery of the vibrating section 22 while leaving the silicon oxide film 34 and the element adjustment layer 30 for protecting the vibrating section 22, the piezoelectric driver 40, and the electrode pad 50. At this time, the trench 13d corresponding to the trench 13c and the first protection film 41 formed on the trench 13d have a function as a second protection film for protecting the vibrating section 22 and the piezoelectric driver 40 from a side etching by an etching solution.

Figure 4I:
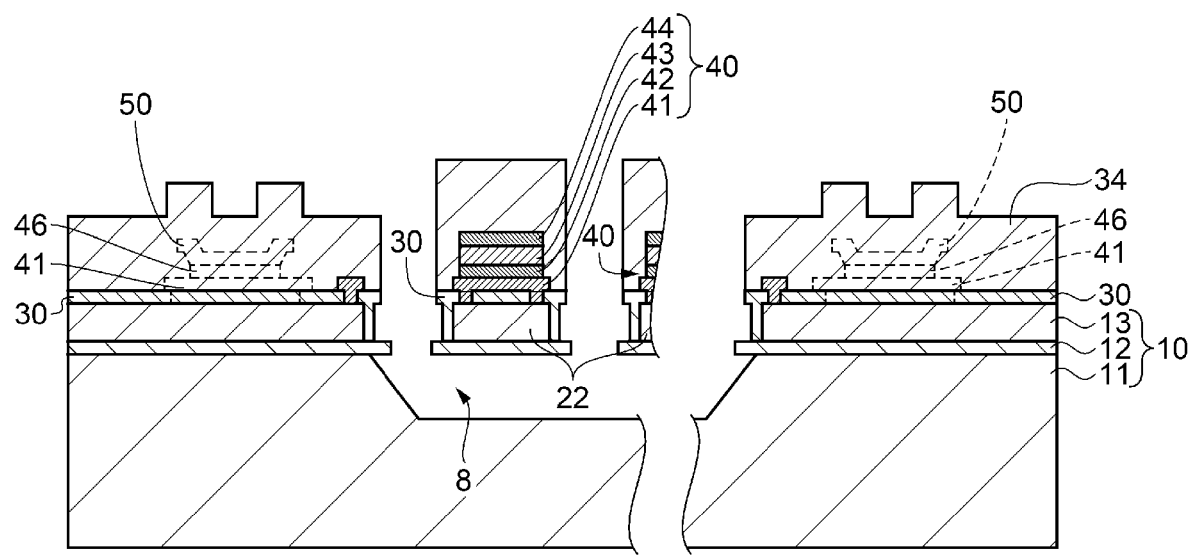
FIG. 4I is a schematic cross-sectional view showing a manufacturing step of the MEMS element.

In a ninth step, as shown in FIG. 4I, after peeling off the resist 16, the cavity 8 is formed in the silicon layer 11 below the vibrating section 22 by etching a part of the silicon in the silicon layer 11 at the time of etching the silicon around the vibrating section 22 through the opening section of the silicon oxide film 34, the element adjustment layer 30, the surface silicon layer 13, and the BOX layer 12. In the ninth step, a wet etching is performed, and, as an etching solution, for example, a tetramethylammonium hydroxide (TMAH) is used.

Figure 4J:
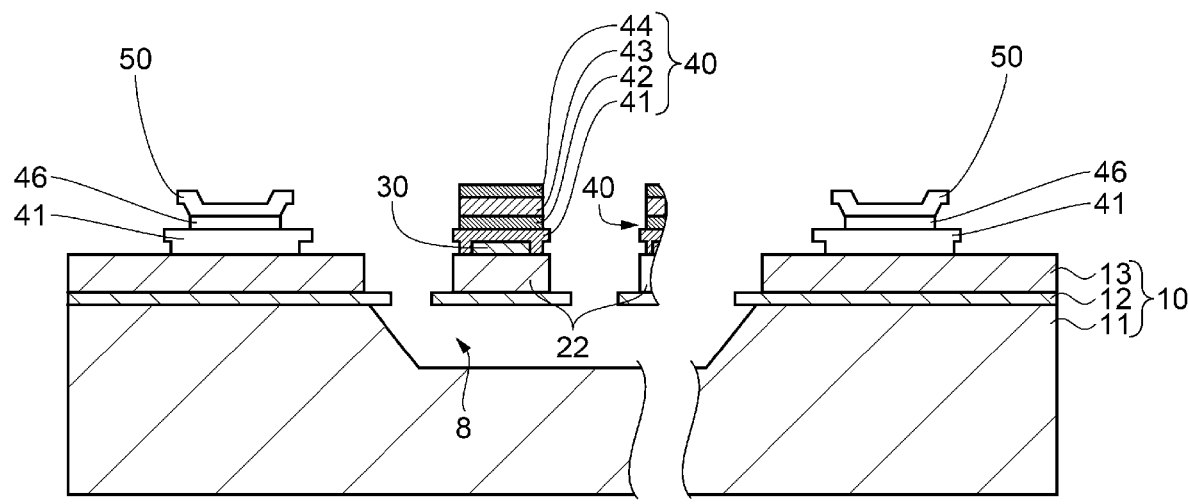
FIG. 4J is a schematic cross-sectional view showing a manufacturing step of the MEMS element.

In a tenth step, as shown in FIG. 4J, the vibrating section 22, the piezoelectric driver 40, the electrode pad 50, the silicon oxide film 34 around the first pore section 62, the element adjustment layer 30, and the BOX layer 12 are etched. As a result, the element adjustment layer 30 remains on the vibrating section 22. In the tenth step, a wet etching is performed, and, as an etching solution, for example, a buffered hydrofluoric acid (BHF) is used. According to the first to tenth steps as described above, the MEMS element 20 as a vibrator can be formed on a part of the SOI substrate 10 as a base.

Lid Forming Step

In the lid forming step (step S103), the silicon substrate 5b is joined to the glass substrate 5a which is a substrate having a light transmitting property, and the silicon substrate 5b joined to the glass substrate 5a is etched in a frame-form to form the lid 5.

First, as a preparation step of the lid forming step (step S103), a glass substrate 5a having a light transmitting property and a silicon material 105 formed on a frame-form silicon substrate 5b are prepared. The glass substrate 5a has a thickness of substantially 100 µm, has a light transmitting property, and is formed of a glass plate containing alkali ions. The silicon material 105 has a thickness of substantially 50 µm to 150 µm, and is formed of a single crystal silicon plate or the like.

Figure 5A:
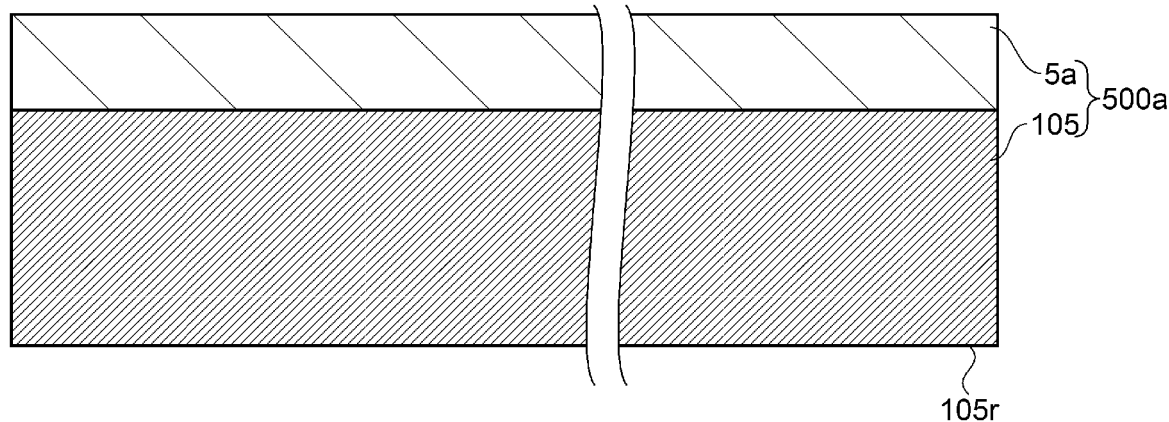
FIG. 5A is a schematic cross-sectional view showing a manufacturing step of a lid.
Figure 5B:
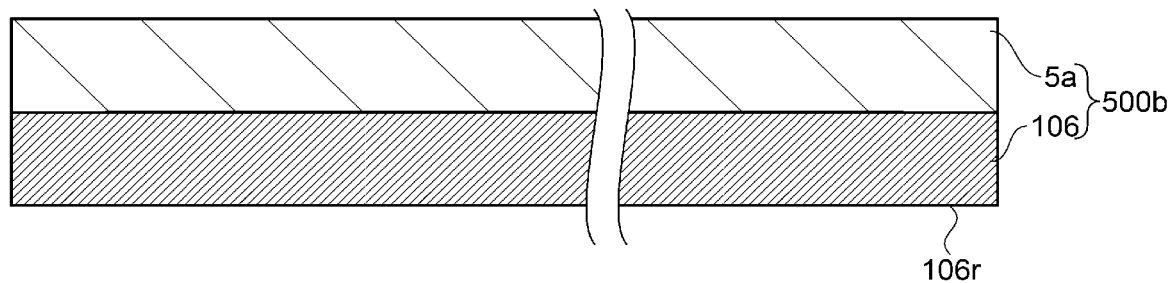
FIG. 5B is a schematic cross-sectional view showing a manufacturing step of the lid.

Next, as shown in FIG. 5A, by superimposing the glass substrate 5a and the silicon material 105, a composite substrate 500a is formed as a joined substrate, for example, using an anode joining method. Then, as shown in FIG. 5B, the silicon material 105 of the composite substrate 500a is ground and polished from a side of an exposed surface 105r opposite to a joining part with the glass substrate 5a to form a predetermined thickness of substantially 50 µm, and for example, a silicon substrate 106 molded into a predetermined thickness of substantially 50 µm, is formed. Note that the silicon material 105 molded into a predetermined thickness and a predetermined surface state may be prepared in advance, and joined to the glass substrate 5a to form the composite substrate 500b. In this case, a step of grinding and polishing the silicon material 105 after a formation of the composite substrate 500a as shown in FIG. 5A may not be performed.

Figure 5C:
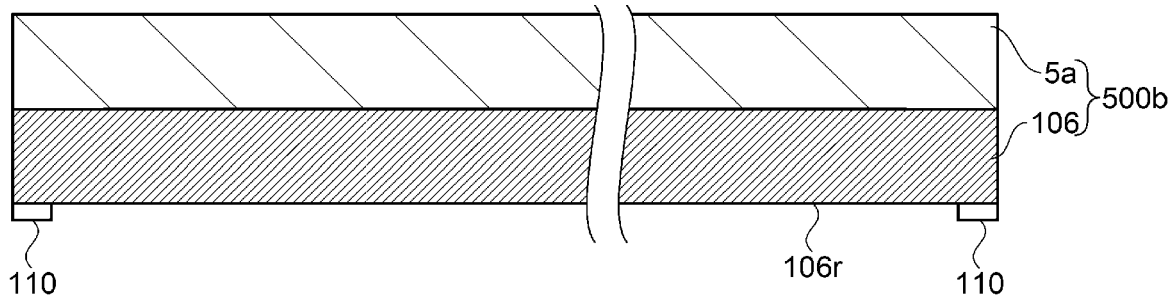
FIG. 5C is a schematic cross-sectional view showing a manufacturing step of the lid.
Figure 5D:
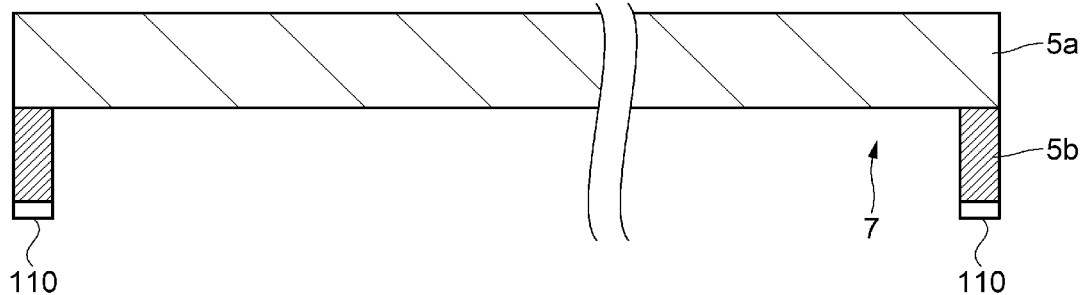
FIG. 5D is a schematic cross-sectional view showing a manufacturing step of the lid.

Next, as shown in FIG. 5C, a resist is applied to a polished surface 106r of the silicon substrate 106, a mask pattern is formed by using a photolithography method, and the silicon substrate 106 is etched using the resist formed as the mask pattern as a mask 110. The etching at this time uses, for example, a dry etching method. By the etching, as shown in FIG. 5D, a center part of the silicon substrate 106 is removed in a direction substantially perpendicular to the polished surface 106r, and a frame-form silicon substrate 5b having a frame section in which an outer edge part remains in a frame-form, is formed. Note that by using a dry etching method, it is possible to form a frame section with a high dimensional accuracy in which a variation in a form of a frame is reduced. Further, in an inside of the frame section, the removed part of the silicon substrate 106 becomes the cavity 7 of the lid 5.

Figure 5E:
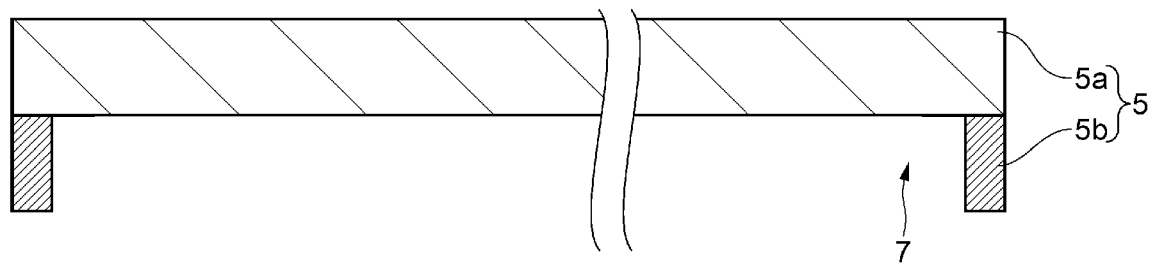
FIG. 5E is a schematic cross-sectional view showing a manufacturing step of the lid.

Then, by removing the resist forming the mask 110, as shown in FIG. 5E, the lid 5 in which the frame-form silicon substrate 5b is joined to the glass substrate 5a which is a substrate having a light transmitting property, is formed. As a result, it is possible to realize the lid 5 having a light transmitting property and having a small variation in a form of the frame section which is a part joined to the SOI substrate 10.

Joining Step

In the joining step (step S105), as shown in FIG. 6, the MEMS element 20 is disposed in a frame of the frame-form silicon substrate 5b constituting the lid 5, that is, the cavity 7, and the lid 5 is joined to a surface of the SOI substrate 10 on which the MEMS element 20 is formed, specifically, an upper surface of the surface silicon layer 13, at a part of the frame-form silicon substrate 5b. In other words, the silicon substrate 5b constituting the lid 5 is joined to the part surrounding the MEMS element 20 on one surface of the SOI substrate 10. As a joining at this time, a direct silicon-silicon joining is applied between the surface silicon layer 13 of the SOI substrate 10 and the frame-form silicon substrate 5b constituting the lid 5. Here, as another joining method for joining the lid 5 and the SOI substrate 10, an anode joining, a joining method using a joining member such as a low melting glass, or the like can be applied.

Note that although not described in detail in the description of the present manufacturing method, after the joining step (step S105), a first wiring through hole 52 and a first pore section 62 can be formed in the silicon layer 11 and the BOX layer 12 of the SOI substrate 10. The formation of the first wiring through hole 52 and the first pore section 62 is performed by forming a silicon oxide film by thermally oxidizing a surface of the SOI substrate 10 opposite to the side on which the BOX layer 12 is disposed, forming a mask of silicon oxide film by using a photolithography method, and etching the silicon layer 11 and the BOX layer 12. In the first wiring through hole 52, the first wiring electrode 58 is formed of a plating layer formed by a plating method. As a material of the first wiring electrode 58, titanium (Ti), tungsten (W), copper (Cu) or the like can be used.

Adjustment Step

Next, in the adjustment step (step S107), as shown in FIG. 7, after the joining step (step S105), the MEMS element 20, specifically the second electrode 44 is irradiated with a laser beam L transmitted through the glass substrate 5a of the lid 5, and a part of the second electrode 44 is removed, for example, by evaporation and sublimation. In this way, by removing the electrode of the MEMS element 20, it is possible to adjust the electrical characteristics, for example, the resonant frequency of the vibrating section 22. In the present step, by removing the electrode of the MEMS element 20 accommodated in the cavities 7 and 8 sealed by the SOI substrate and the lid 5, an adjustment of the electrical characteristics of the MEMS element 20, such as an adjustment of the resonant frequency of the vibrating section 22 described above, can be easily performed from an outside of the lid 5.

According to the manufacturing method of the vibrator device 1 described above, the MEMS element 20 as a vibrator is formed on a part of the SOI substrate 10 as a base, and, inside the frame-form silicon substrate 5b constituting the lid 5, the vibrator device 1 can be manufactured in which the MEMS element 20 is accommodated between the SOI substrate 10 and the glass substrate 5a having a light transmitting property. In other words, it is possible to easily form the vibrator device 1 using the lid 5 which has a light transmitting property, a small variation in a form of the frame section which is formed in a frame form, and a high dimensional accuracy. In the vibrator device 1 manufactured in this manner, the MEMS element 20 in the cavities 7 and 8 can be easily processed using, for example, the laser beam L transmitted through the glass substrate 5a having a light transmitting property, thereby a fine characteristics adjustment can be performed.

Further, it is possible to form the vibrator device 1 provided with a so-called MEMS structure vibrator including the vibrating section 22 integrally formed with the SOI substrate 10, the piezoelectric layer 43 as a piezoelectric body formed on the surface of the vibrating section 22, and the first and second electrodes 42 and 44 as electrodes formed on the surface of the piezoelectric layer 43.

In the embodiment described above, although the MEMS element 20 as a vibrator provided with three vibrating sections 22, has been illustrated as the vibrator device 1, the present disclosure is not limited thereto. The vibrator device can be applied to a tuning fork type vibrating element, an angular velocity sensor element, an acceleration sensor element, a pressure sensor element, or the like, which are provided with two vibrating sections 22.

3. Electronic Device

Figure 8:
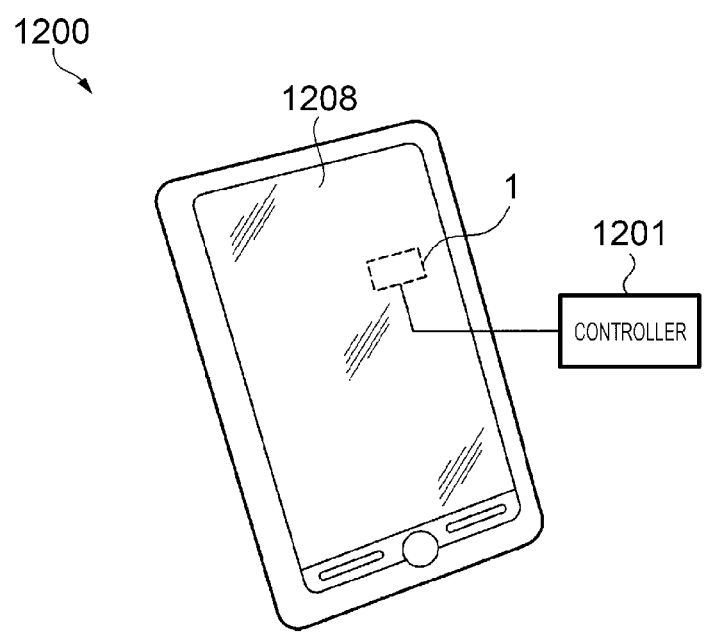
FIG. 8 is a perspective view schematically showing a configuration of a smartphone which is an example of an electronic device.

Next, a smartphone is illustrated as an electronic device using the vibrator device 1 and will be described in detail based on FIG. 8. FIG. 8 is a perspective view schematically showing a configuration of a smartphone which is an example of an electronic device.

In this figure, the smartphone 1200 incorporates the above-described vibrator device 1. An output signal of the vibrator device 1 is transmitted to a controller 1201 of the smartphone 1200. The controller 1201 includes a central processing unit (CPU), and can perform control such as changing a display image displayed on a display unit 1208 by recognizing the posture and behavior of the smartphone 1200 based on the received output signal, sounding a warning sound or a sound effect, and driving a vibration motor to vibrate a main body. In other words, by performing a motion sensing of the smartphone 1200, display contents can be changed and sounds or vibrations or the like can be generated, from the measured posture and behavior. In particular, when executing a game application, it is possible to experience a realistic feeling close to reality.

The smartphone 1200 as an example of such an electronic device includes the above-described vibrator device 1 and the controller 1201, and thus has excellent reliability.

Note that the electronic device provided with the vibrator device 1 can be applied to, for example, various mobile phones, a personal computer, a tablet terminal, a digital still camera, a timepiece, an ink jet type discharging device such as an ink jet printer, a laptop type personal computer, a television, a video camera, a video tape recorder, a car navigation device, a pager, an electronic notebook, an electronic dictionary, a calculator, an electronic game machine, a word processor, a workstation, a videophone, a television monitor for crime prevention, electronic binoculars, a POS terminal, a medical machine, a fish finding machine, various measuring machines, an instrument, a flight simulator, a seismometer, a pedometer, an inclinometer, a vibration meter for measuring a vibration of a hard disk, a posture control device for flying objects such as a robot and a drone, a control machine used for an inertial navigation for automatic driving of a vehicle, or the like, in addition to the above-described smartphone 1200. Examples of the medical machine include, for example, an electronic clinical thermometer, a blood pressure manometer, a blood glucose meter, an electrocardiogram measurement device, an ultrasonic diagnostic device, an electronic endoscope, or the like. The instruments are, for example, instruments of a vehicle, an aircraft, or a ship.

4. Vehicle

Figure 9:
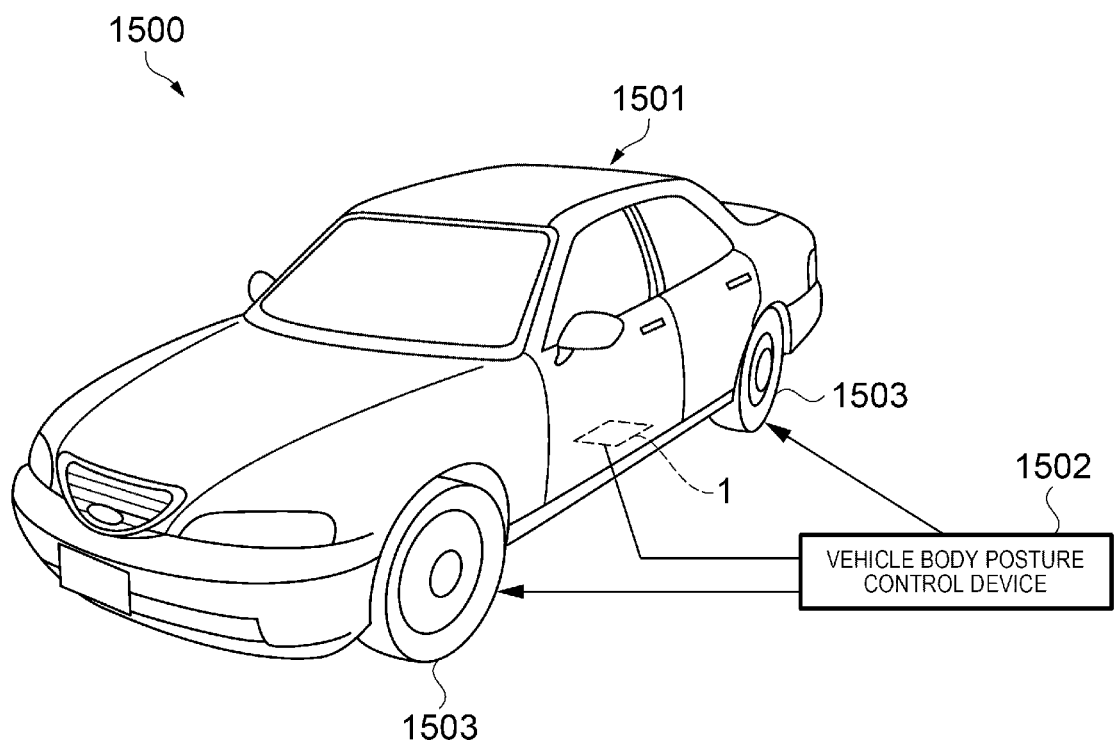
FIG. 9 is a perspective view showing a configuration of a vehicle which is an example of a vehicle.

Next, a vehicle using the vibrator device 1 is shown in FIG. 9, and will be described in detail. FIG. 9 is a perspective view showing a configuration of a vehicle which is an example of a vehicle.

As shown in FIG. 9, the vibrator device 1 is built in the vehicle 1500, and for example, control for detecting movement, position, posture, or the like of the vehicle body 1501 is performed by utilizing an output signal of the vibrator device 1. The output signal of the vibrator device 1 is supplied to a vehicle body posture control device 1502 that controls a movement and a posture of the vehicle body, and the vehicle body posture control device 1502 controls a posture of the vehicle body 1501 based on the signal. The vehicle posture control device 1502 can control, for example, a hardness of a suspension or control brakes of individual wheels 1503.

Note that the vibrator device 1 can be widely applied to an electronic controller (ECU) such as a key-less entry system, an immobilizer, a car navigation system, a car air conditioner, an anti-lock brake system (ABS), an air bag, a tire pressure monitoring system (TPMS), an engine control system, an automatic driving inertial navigation control device, a battery monitor for a hybrid vehicle or an electric vehicle, in addition to the examples described above.

Further, the vibrator device 1 applied to a vehicle can be utilized in, for example, a movement or a posture control of a biped robot, a train, or the like, a remote control of a radio controlled aircraft, a radio controlled helicopters, a drone, or the like, a movement or a posture control of an autonomous flying object, a movement or a posture control of an agricultural machine or a construction machine, a control of a rocket, a satellite, a ship, and an automatic guided vehicle (AGV), or the like, in addition to the examples described above. As described above, in realizing a position control or a posture control of various vehicles, the vibrator device 1, and each controller (not shown) or a posture controller are incorporated.

Such a movable object has excellent reliability because the movable object includes the vibrator device 1, the controller, and, for example, the vehicle body posture control device 1502 as a posture controller.

Further, the vibrator device 1 has a control device mounted on each of a plurality of vehicles, and can be used in a driving support system for performing an automatic driving for automatically controlling at least one of acceleration, braking, and steering.

Hereinafter, the contents derived from the above-described embodiments will be described as each aspect.

Aspect 1

A vibrator device according to the present aspect includes: a base provided with a vibrator at one surface side; and a lid including a substrate having a light transmitting property and a frame-form silicon substrate joined to the substrate, in which the silicon substrate is joined to a part of the base surrounding the vibrator in the one side.

According to the present aspect, the lid is configured with the substrate having a light transmitting property and the frame-form silicon substrate joined to the substrate. In the silicon substrate joined to the substrate having a light transmitting property, a frame section having a frame form with a high accuracy is formed by using, for example, a dry etching method. Therefore, it is possible to provide the vibrator device using the lid having a light transmitting property and a small variation in a form of the frame section joined to the substrate. Note that, by making the lid to have a light transmitting property, it is possible to adjust the characteristics of the vibrator by using, for example, a laser beam transmitted through the lid.

Aspect 2

In the vibrator device according to the above aspect, the substrate may be glass.

According to the present aspect, by making the substrate glass, the substrate may be easily obtained at a low cost.

Aspect 3

In the vibrator device according to the above aspect, the glass may contain an alkali ion.

According to the present aspect, by using the glass containing alkali ions as a substrate, the substrate and the silicon substrate (element plate of a frame-form silicon substrate) may be easily joined by using an anode joining.

Aspect 4

In the vibrator device according to the above aspect, the vibrator may include a vibrating section integrally configured with the base, a piezoelectric body disposed above the vibrating section, and an electrode disposed above a surface of the piezoelectric body.

According to the present aspect, the vibrator, which is provided with the piezoelectric body provided on the vibrating section and the electrode provided on the surface of the piezoelectric body, may be the vibrator device accommodated between the base and the substrate having a light transmitting property inside the frame-form silicon substrate. In such a vibrator device, a characteristic adjustment of the accommodated vibrator may be performed by, for example, a laser beam transmitted through the substrate having a light transmitting property.

Aspect 5

A manufacturing method of a vibrator device according to the present aspect includes: a base forming step of forming a vibrator at one surface side of a base; a lid forming step of joining a silicon substrate to a substrate having a light transmitting property and forming a lid by etching the silicon substrate in a frame-form; and a joining step of joining the silicon substrate to a part of the base surrounding the vibrator of the one surface.

According to the present aspect, the vibrator is formed at one surface side of the base, and the frame-form silicon substrate constituting the lid is joined to a part of the base surrounding the vibrator of the one surface. That is, it is possible to manufacture a vibrator device in which the vibrator is accommodated between the base and the substrate having a light transmitting property inside the frame section of the frame-form silicon substrate constituting the lid, in plan view. In other words, it is possible to easily form the vibrator device using the lid which has a light transmitting property, a small variation in a form of the frame section, and a high dimensional accuracy. In such a vibrator device manufactured in this manner, the vibrator accommodated in the base and the lid can be easily processed and a characteristic adjustment can be performed by, for example, a laser beam transmitted through the substrate having a light transmitting property.

Aspect 6

In the manufacturing method of the vibrator device according to the above aspect, in the base forming step, an outer form of the vibrator including the vibrating section may be formed, a piezoelectric body may be formed in the vibrating section, and an electrode may be formed on a surface of the piezoelectric body.

According to the present aspect, it may be possible to form the vibrator device provided with a so-called MEMS structured vibrator including the vibrating section integrally formed with the base, the piezoelectric body formed on the vibrating section, and the electrode formed on the surface of the piezoelectric body.

Aspect 7

The manufacturing method of the vibrator device according to the above aspect may further include an adjustment step of removing a part of the electrode by irradiating the electrode with a laser beam transmitted through the lid, after the joining step.

According to the present aspect, a characteristic adjustment of the accommodated vibrator may be easily performed from the outside of the lid by irradiating the electrode with, for example, a laser beam transmitted through the substrate, which has a light transmitting property and constitutes the lid, and removing a part of the electrode.

Aspect 8

An electronic device according to the present aspect includes the vibrator device according to any one of the above and a controller that performs a control based on an output signal of the vibrator device.

According to the present aspect, since the vibrator device described above is included and the controller performs a control based on the output signal, reliability of the electronic device can be enhanced.

Aspect 9

A vehicle according to the present aspect includes the vibrator device according to any one of the above and a controller that performs a control based on an output signal of the vibrator device.

According to the present aspect, since the vibrator device described above is included and the controller performs a control based on the output signal, reliability of the vehicle can be enhanced.

What is claimed is:

1. A vibrator device comprising:
    a base;
    a vibrator disposed in the base, the vibrator including a plurality of vibrating sections extending along a first direction and arranged along a second direction that intersects the first direction; and
    a lid including
    a substrate having a light transmitting property and
    a silicon substrate joined to the substrate and a part of the base surrounding the vibrator, wherein
    the base is formed from a silicon on insulator (SOI) substrate including a surface silicon layer,
    the vibrator and the part of the base surrounding the vibrator are formed from the surface silicon layer,
    the silicon on insulator (SOI) substrate includes a pair of wiring through holes that penetrate from the surface silicon layer to an outer surface opposite to a surface silicon layer side, that are arranged one by one on both outsides of the plurality of vibrating sections in the second direction, and the pair of wiring through holes have wiring electrodes inside, and
    the silicon on insulator (SOI) substrate includes a sealing hole penetrating from the surface silicon layer to an outer surface opposite to a surface silicon layer side that is disposed outside of the vibrating section in the first direction and filled with a sealing material.

2. The vibrator device according to claim 1, wherein the substrate is glass.

3. The vibrator device according to claim 2, wherein the glass contains an alkali ion.

4. The vibrator device according to claim 1, wherein the vibrator includes a piezoelectric body disposed above the vibrating section, and an electrode disposed above the piezoelectric body.

5. A manufacturing method of a vibrator device comprising:
    preparing a base formed of a silicon on insulator (SOI) substrate including a surface silicon layer, that has a vibrator and a part of the base surrounding the vibrator which is are formed from the surface silicon layer, and the vibrator includes a plurality of vibrating sections extending along a first direction and arranged along a second direction that intersects the first direction, wherein the silicon on insulator (SOI) substrate includes a base silicon layer and a buried oxide (BOX) layer, and the base silicon layer, the buried oxide (BOX) layer and the surface silicon layer are laminated in this order, and the silicon on insulator (SOI) substrate further includes a sealing hole disposed on one outside of the vibrating sections in the first direction;
    joining a silicon substrate to a substrate having a light transmitting property;
    etching an inside of the silicon substrate;
    joining the silicon substrate to the part of the base surrounding the vibrator;
    forming a pair of wiring through holes penetrating the silicon on insulator (SOI) substrate from the surface silicon layer to an outer surface opposite to a surface silicon layer side so as to be arranged one by one on both outsides of the plurality of vibrating sections in the second direction and forming wiring electrodes in the wiring through holes by a plating method;
    forming a first pore section penetrating from the base silicon layer to the buried oxide (BOX) layer;
    forming a second pore section penetrating the surface silicon layer; and
    filling the sealing hole formed by communicating the first pore section and the second pore section with a sealing material.

6. The manufacturing method of a vibrator device according to claim 5, wherein
    the vibrator includes an electrode, and
    the method further comprises
    removing a part of the electrode by irradiating the electrode with a laser beam transmitted through the lid, after the joining.

7. An electronic device comprising:
    a vibrator device including
    a base,
    a vibrator disposed in the base, the vibrator including a plurality of vibrating sections extending along a first direction and arranged along a second direction that intersects the first direction, and
    a lid including
    a substrate having a light transmitting property and a silicon substrate joined to the substrate and a part of the base surrounding the vibrator; and a controller that performs a control based on an output signal of the vibrator device, wherein the base is formed from a silicon on insulator (SOI) substrate including a surface silicon layer, the vibrator and the part of the base surrounding the vibrator are formed from the surface silicon layer, the silicon on insulator (SOI) substrate includes a pair of wiring through holes that penetrate from the surface silicon layer to an outer surface opposite to a surface silicon layer side, that are arranged one by one on both outsides of the plurality of vibrating sections in the second direction, and the pair of wiring through holes have wiring electrodes inside, and the silicon on insulator (SOI) substrate includes a sealing hole penetrating from the surface silicon layer to an outer surface opposite to a surface silicon layer side that is disposed outside of the vibrating section in the first direction and filled with a sealing material.

8. A vehicle comprising:

a vibrator device including a base, a vibrator disposed in the base, and a lid including a substrate having a light transmitting property and a silicon substrate joined to the substrate and a part of the base surrounding the vibrator; and a controller that performs a control based on an output signal of the vibrator device, wherein the base is formed from a silicon on insulator (SOI) substrate including a surface silicon layer, the vibrator and the part of the base surrounding the vibrator are formed from the surface silicon layer, the silicon on insulator (SOI) substrate includes a pair of wiring through holes that penetrate from the surface silicon layer to an outer surface opposite to a surface silicon layer side, that are arranged one by one on both outsides of the plurality of vibrating sections in the second direction, and the pair of wiring through holes have wiring electrodes inside, and wherein the silicon on insulator (SOI) substrate includes a sealing hole penetrating from the surface silicon layer to an outer surface opposite to a surface silicon layer side that is disposed outside of the vibrating section in the first direction and filled with a sealing material.

\* \* \* \* \*